United States Patent
Hsu et al.

(10) Patent No.: US 9,263,143 B2
(45) Date of Patent: Feb. 16, 2016

(54) THREE DIMENSIONAL MEMORY DEVICE AND DATA ERASE METHOD THEREOF

(71) Applicant: Macronix International Co., Ltd., Hsinchu (TW)

(72) Inventors: Tzu-Hsuan Hsu, Chiayi County (TW); Hang-Ting Lue, Hsinchu (TW); Chen-Jun Wu, Changhua County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 23 days.

(21) Appl. No.: 14/330,106

(22) Filed: Jul. 14, 2014

(65) Prior Publication Data
US 2016/0012901 A1    Jan. 14, 2016

(51) Int. Cl.
*G11C 11/34* (2006.01)
*G11C 16/16* (2006.01)
*G11C 16/04* (2006.01)
*H01L 27/115* (2006.01)

(52) U.S. Cl.
CPC ............ *G11C 16/16* (2013.01); *G11C 16/0408* (2013.01); *G11C 16/0483* (2013.01); *H01L 27/1157* (2013.01)

(58) Field of Classification Search
CPC .... G11C 16/0483; G11C 16/14; G11C 16/16; G11C 2213/71; G11C 11/5635; H01L 27/1157; H01L 27/11582; H01L 27/11524; H01L 27/2481; H01L 27/11529; H01L 27/11556; H01L 27/11578; G06F 12/0246
USPC ............ 365/185.03, 185.05, 185.06, 185.11, 365/185.13, 185.17, 185.18, 185.29, 63, 365/218
See application file for complete search history.

(56) References Cited

U.S. PATENT DOCUMENTS

2012/0307557 A1* 12/2012 Itagaki ............... G11C 16/0483
                                                                365/185.02
2013/0163336 A1    6/2013  Li et al.

* cited by examiner

*Primary Examiner* — Fernando Hidalgo
(74) *Attorney, Agent, or Firm* — McClure, Qualey & Rodack, LLP

(57) ABSTRACT

A data erase method of a three dimensional (3D) memory device comprising the following steps. First, in a first phase of an erase operation, a first voltage is applied to a first semiconductor channel of the semiconductor channels to erase data stored in the memory cells defined on the first semiconductor channel and a second voltage is applied to a second semiconductor channel of the semiconductor channels, wherein the second semiconductor channel is adjacent to the first semiconductor channel. Then, in a second phase of the erase operation, the second voltage is applied to the first semiconductor channel and the first voltage is applied to the second semiconductor channel.

14 Claims, 4 Drawing Sheets

THREE DIMENSIONAL MEMORY DEVICE AND DATA ERASE METHOD THEREOF

TECHNICAL FIELD

The disclosure relates in general to an integrated circuits and an operation method thereof, and more particularly to a three-dimensional (3D) memory device and a data erase method thereof.

BACKGROUND

With advances in the integrated circuit manufacturing technology, 3D memory devices with multiple planes of memory cells are provided to achieve greater storage capacity. Conventionally, when performing data erasing on a memory device, electron holes must be generated via gated-induce drain leakage (GIDL) currents at the string select line (SSL) or the ground select line (GSL) gate edge. However, minority carrier is generally slow and very sensitive to junction engineering and thus decreasing the data erase time.

Therefore, there is a need for a technology for improving the data erasing speed of 3D memory devices.

SUMMARY

The disclosure is directed to a 3D memory device and a data erase method thereof. Erasing with multiple phases is utilized. In each phase, the selected semiconductor channels are applied by an erase voltage, while the unselected semiconductor channels adjacent to the selected semiconductor channels are biased by a voltage different from the erase voltage so that the total data easing time can be improved and larger operation memory window can be generated.

According to one embodiment, a data erase method of a three dimensional (3D) memory device is provided. The 3D memory device comprises a plurality of word lines and semiconductor channels. The semiconductor channels intersect with the word lines to form a plurality of memory cells. The data erase method comprises the following steps. First, in a first phase of an erase operation, a first voltage is applied to a first semiconductor channel of the semiconductor channels to erase data stored in the memory cells defined on the first semiconductor channel and a second voltage is applied to a second semiconductor channel of the semiconductor channels, wherein the second semiconductor channel is adjacent to the first semiconductor channel. Then, in a second phase of the erase operation, the second voltage is applied to the first semiconductor channel and the first voltage is applied to the second semiconductor channel.

According to another embodiment, a 3D memory device is provided. The 3D memory device comprises a plurality of word lines and semiconductor channels, wherein the semiconductor channels intersect with the word lines to form a plurality of memory cells. In a first phase of an erase operation, a first voltage is applied to a first semiconductor channel of the semiconductor channels to erase data stored in the memory cells defined on the first semiconductor channel and a second voltage is applied to a second semiconductor channel of the semiconductor channels, wherein the second semiconductor channel is adjacent to the first semiconductor channel. In a second phase of the erase operation, the second voltage is applied to the first semiconductor channel and the first voltage is applied to the second semiconductor channel.

According to yet another embodiment, a 3D memory device is provided. The 3D memory device comprises a plurality of word lines and semiconductor channels, wherein the semiconductor channels intersect with the word lines to form a plurality of memory cells. The semiconductor channels comprises a plurality of first semiconductor channels and a plurality of second semiconductor channels disposed alternately with the first semiconductor channels. In a first phase of an erase operation, a first voltage is applied to the first semiconductor channels to erase data stored in the memory cells defined on the first semiconductor channels and a second voltage is applied to the second semiconductor channels. In a second phase of the erase operation, the second voltage is applied to the first semiconductor channels and the first voltage is applied to the second semiconductor channels.

The above and other aspects of the disclosure will become better understood with regard to the following detailed description of the non-limiting embodiment(s). The following description is made with reference to the accompanying drawings.

Figure 1:
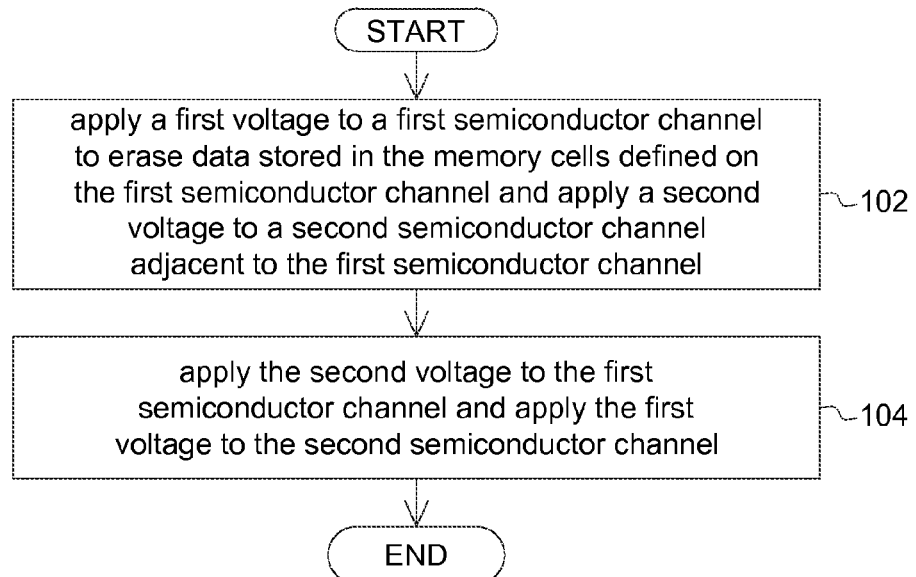
FIG. 1 illustrates a flow chart of a data erase method of a 3D memory device according to an embodiment of the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 illustrates a flow chart of a data erase method of a 3D memory device according to an embodiment of the present invention. The 3D memory device comprises a plurality of word lines and semiconductor channels. The semiconductor channels intersect with the word lines to form a plurality of memory cells. At step 102, in a first phase of an erase operation, a first voltage is applied to a first semiconductor channel of the semiconductor channels to erase data stored in the memory cells defined on the first semiconductor channel and a second voltage is applied to a second semiconductor channel of the semiconductor channels adjacent to the first semiconductor channel. At step 104, in a second phase of the erase operation, the second voltage is applied to the first semiconductor channel and the first voltage is applied to the second semiconductor channel.

In embodiments, the semiconductor channel used may comprise a polysilicon or other suitable materials. The first voltage can be an erasing voltage used to erase the memory data. When performing erase operation, the voltage across the semiconductor channel and the word line may cause the electron holes to move to the floating gate to compensate the electronics so that the data stored in the memory cell can be erased.

In the embodiment, the voltage level of the first voltage is different from that of the second voltage. In an example, the voltage polarity of the first voltage can be opposite to that of the second voltage. For example, the voltage level of the first voltage is 14V and the voltage level of the second voltage is −4V. In the first phase of the erase operation, the second semiconductor channel applied with the second voltage may act as a back gate. Due to the electrical coupling effect, the back gate can induce additional holes in the first semiconductor channel and thus the data erasing speed for the memory cells of the first semiconductor channel can be speeded up. Then, in the second phase of the erase operation, the first semiconductor channel applied with the second voltage acts as the back gate instead. Due to the electrical coupling effect, the back gate can induce additional holes in the second semiconductor channel and thus the data erasing speed for the memory cells of the second semiconductor channel can be speeded up. Because the data erase time for the first and second semiconductor channels are significantly decreased, the total data erasing speed of the 3D memory device can be speeded up.

The number of the first and second semiconductor channels can be plural. The first semiconductor channels and the second semiconductor channels can be disposed alternately with each other. In the first phase of the erase operation, the first semiconductor channels are selected and applied by the first voltage to erase data stored in the memory cells defined on the first semiconductor channels, while the unselected second semiconductor channels are applied by the second voltage. In the second phase of the erase operation, the second semiconductor channels are selected instead. The second voltage is applied to the unselected first semiconductor channels and the first voltage is applied to the selected second semiconductor channels. By multiple phases of erasing, the data erasing speed of the memory can be significantly speeded up.

The data erase method according to the embodiments of the present invention can be applied on a memory device with 3D vertical gate (3DVG) structure or 3D vertical channel (3DVC) structure.

Figure 2:
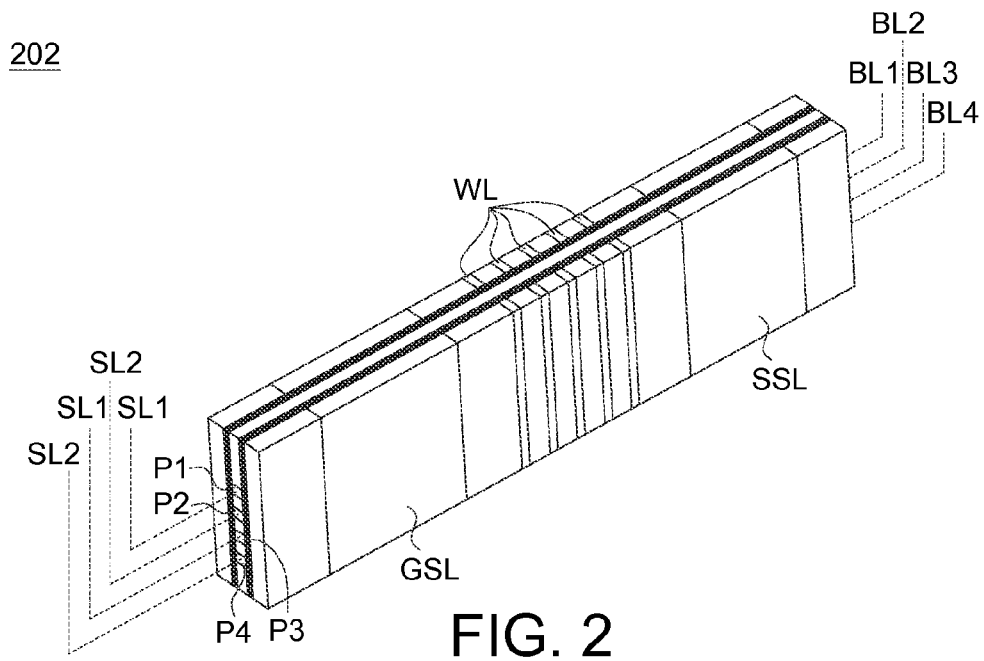
FIG. 2 illustrates a partial schematic diagram of a memory device with 3DVG memory structure.
Figure 3:
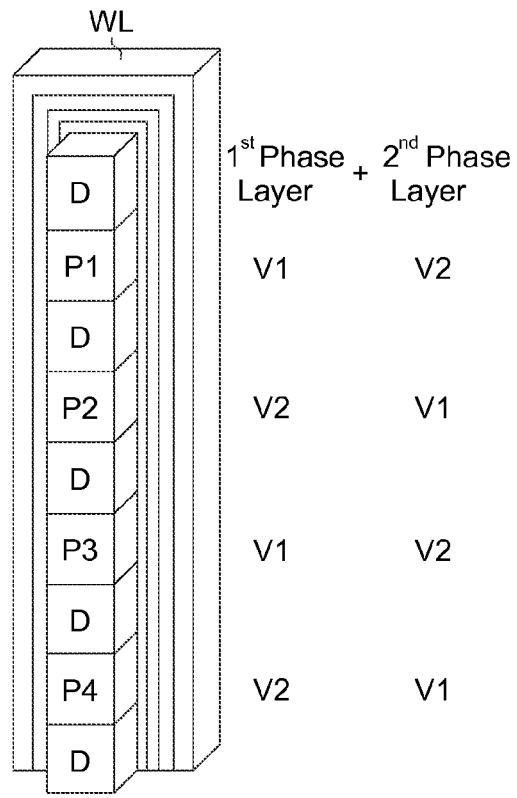
FIG. 3 illustrates a schematic diagram of a memory stack of the memory device shown in FIG. 2.

FIG. 2 illustrates a partial schematic diagram of a memory device with 3DVG memory structure. FIG. 3 illustrates a schematic diagram of a memory stack of the memory device shown in FIG. 2. As shown in FIGS. 2 and 3, multiple semiconductor channels P1-P4 are disposed on different layers of a memory stack 202. The word lines WL are disposed on the sidewall of the memory stack 202. Two adjacent semiconductor channels, e.g., channels P1 and P2, are disposed on adjacent layers of the memory stack 202 and separated by a dielectric strip D.

In the first phase of the erase operation, the semiconductor channels P1 and P3 are selected. Both ends of each selected semiconductor channel P1 and P3 located at odd layers are applied by the first voltage to erase data, while both ends of each unselected semiconductor channel P2 and P4 located at even layers are applied by the second voltage. At this time, the unselected semiconductor channels P2 and P4 are, for example, maintained in a non-erased state. Then, in the second phase of the erase operation, the semiconductor channels P2 and P4 are selected instead. Both ends of each unselected semiconductor channel P1 and P3 are applied by the second voltage, while both ends of each selected semiconductor channel P2 and P4 are applied by the first voltage. Because the memory cells defined on the semiconductor channels P1 and P3 has been erased in the first phase, the semiconductor channels P1 and P3 are maintained in an erased state in the second phase. With the two phases of erase operation, the data block can be erased and the data erasing speed can be significantly speeded up.

In the example of FIGS. 2 and 3, both ends of each semiconductor channel P1-P4 are connected to a bit line and a source line, respectively. Each semiconductor channel P1-P4 is connected to the bit line via a string select line (SSL) and connected to the source line via a ground select line (GSL). In the embodiment, the source line SL1 connected to semiconductor channels P1 and P3 is independent from the source line SL2 connected to semiconductor channels P2 and P4. In the first phase of the erase operation, the first voltage is simultaneously applied to the semiconductor channels P1 and P3 via respective bit lines BL1 and BL3 and a first source line SL1, and the second voltage is simultaneously applied to the semiconductor channels P2 and P4 via respective bit lines BL2 and BL4 and a second source line SL2. In the second phase of the erase operation, the second voltage is simultaneously applied to the semiconductor channels P1 and P3 via respective bit lines BL1 and BL3 and the first source line SL1, and the first voltage is simultaneously applied to the semiconductor channels P2 and P4 via respective bit lines BL2 and BL4 and the second source line SL2. It is understood that in the embodiments, quantity of the semiconductor channel, the word line, the bit line and the source line is not limited to that shown in FIGS. 2 and 3, and may be more or less according to actual demands. Moreover, in the embodiments, the order of the first and second phases of the erase operation can be altered.

Figure 4:
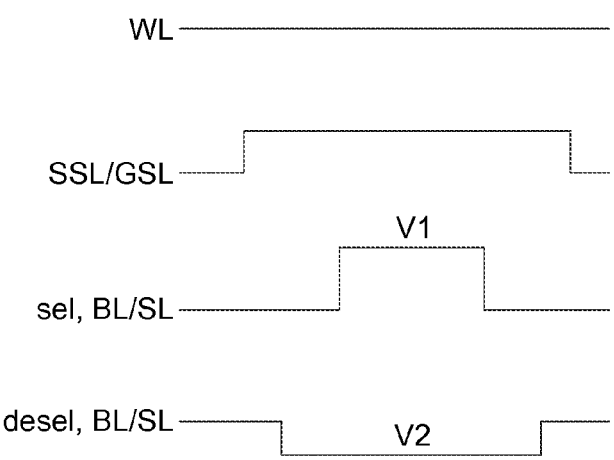
FIG. 4 illustrates a waveform diagram of one of the phases of the erase operation according to the embodiments of the present invention.

FIG. 4 illustrates a waveform diagram of one of the phases of the erase operation according to the embodiments of the present invention. As shown in FIG. 4, the word line WL is applied by a voltage about 0V in the erase operation, and the string select line SSL and the ground select line GSL is applied by a voltage about 6V. The selected bit line and source line (sel, BL/SL) are applied by a voltage about 14V to erase the data of the memory cells of the selected semiconductor channel. The other unselected bit lines and source lines (desel, BL/SL) are applied by a voltage about −4V to make the adjacent semiconductor channels act as a back gate.

Figure 5:
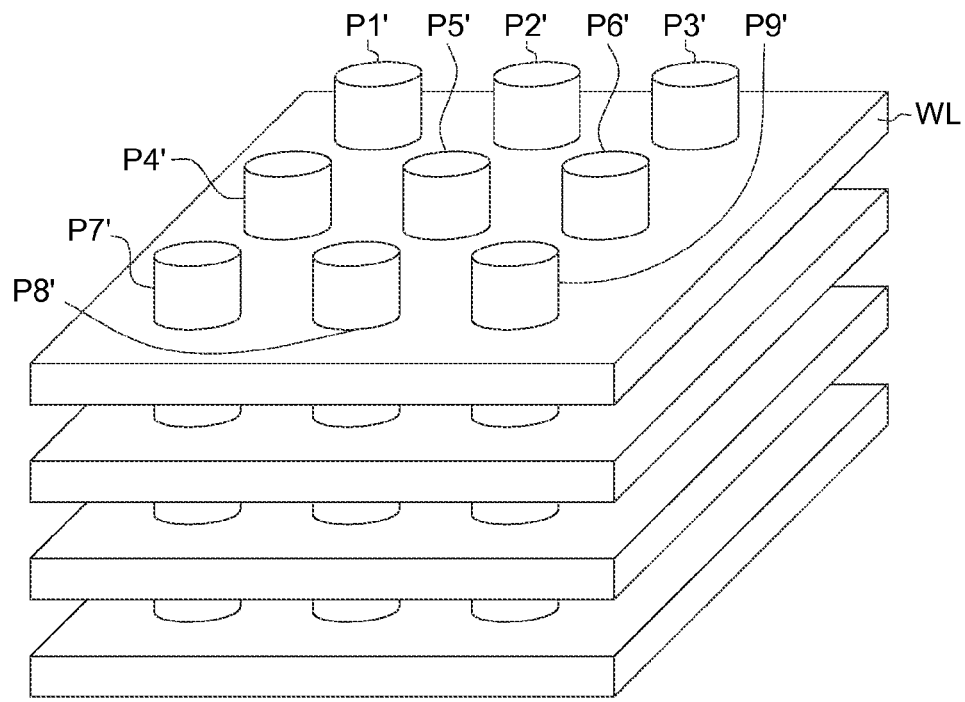
FIG. 5 illustrates a partial schematic diagram of a memory device with 3DVC structure.
Figure 6:
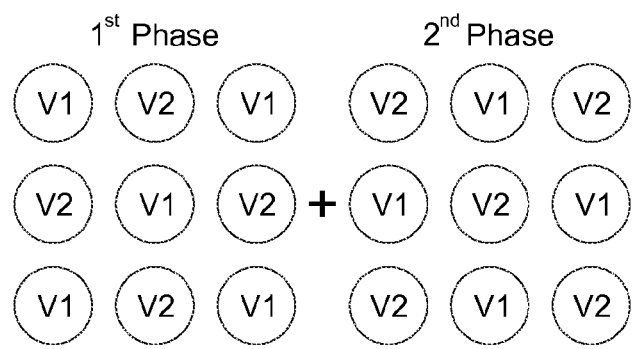
FIG. 6 illustrates a schematic diagram of the erase operation for the memory device shown in FIG. 5.

FIG. 5 illustrates a partial schematic diagram of a memory device with 3DVC structure. FIG. 6 illustrates a schematic diagram of the erase operation for the memory device shown in FIG. 5. As shown in FIG. 5, the semiconductor channels P1'-P9' vertically pass through the word lines WL to constitute a 3DVC structure. The first group of the semiconductor channels P1', P3', P5', P7' and P9' are disposed alternately with the second group of the semiconductor channels P2', P4', P6' and P8'.

In the example of FIG. 6, in the first phase of the erase operation, the semiconductor channels P1', P3', P5', P7' and P9' are selected to be erased. Both ends of each selected semiconductor channel P1', P3', P5', P7' and P9' are applied by the first voltage V1 to erase data, while both ends of each unselected semiconductor channel P2', P4', P6' and P8' are applied by the second voltage V2. At this time, the unselected semiconductor channels P2', P4', P6' and P8' are, for example, maintained in a non-erased state. In the second phase of the erase operation, the semiconductor channels P2', P4', P6' and P8' are selected instead. Both ends of each unselected semiconductor channel P1', P3', P5', P7' and P9' are applied by the second voltage V2, while both ends of each selected semiconductor channel P2', P4', P6' and P8' are applied by the first voltage V1 to erase data. Because the memory cells defined on the semiconductor channels P1', P3', P5', P7' and P9' has be erased in the first phase, the semiconductor channels P1', P3', P5', P7' and P9' are maintained in an erased state in the second phase. With the two phases of erase operation, the data block can be erased and the data erasing speed can be speeded up.

Figure 7:
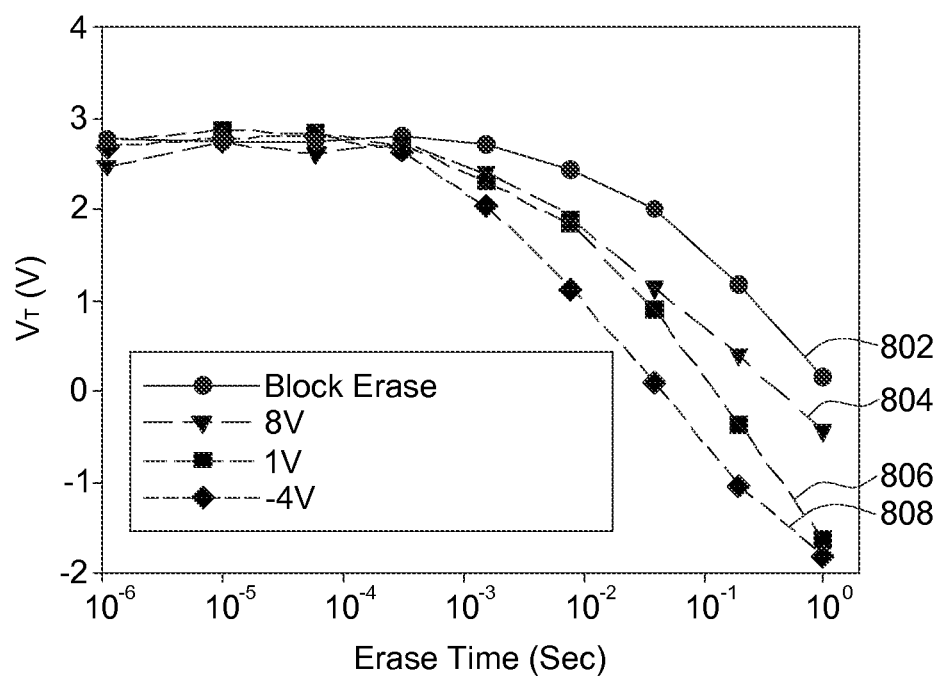
FIG. 7 illustrates the relation between the erase time and the threshold voltage ($V_T$) of a memory cell under when the unselected semiconductor channel is biased by a voltage of 8V, 1V or −4V.

FIG. 7 illustrates the relation between the erase time and the threshold voltage ($V_T$) of a memory cell when the unselected semiconductor channel is biased by different voltages. For the curve 802, conventional block erase operation is performed (i.e., all semiconductor channels are applied by an erase voltage simultaneously). For the curve 804, the unselected semiconductor channel is biased by a voltage of 8V. For the curve 806, the unselected semiconductor channel is biased by a voltage of 1V. For the curve 808, the unselected semiconductor channel is biased by a voltage of –4V. As can be seen from FIG. 7, when the voltage difference between the selected semiconductor channel and unselected semiconductor channel becomes larger, the required erase time can be significantly decreased. Compared to block erase operation, the required erase time of the multi-phase erase operation can be reduced by several orders of magnitude.

Based on the abovementioned embodiments, erasing with multiple phases is utilized. In each phase, the selected semiconductor channels are applied by an erase voltage, while the unselected semiconductor channels adjacent to the selected semiconductor channels are biased by a voltage different from the erase voltage so that the total data easing time can be improved and larger operation memory window can be generated.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A data erase method of a three dimensional (3D) memory device, wherein the 3D memory device comprises a plurality of word lines and a plurality of semiconductor channels, the semiconductor channels intersect with the word lines to form a plurality of memory cells, the data erase method comprises:
   in a first phase of an erase operation, applying a first voltage to a first semiconductor channel of the semiconductor channels to erase data stored in the memory cells defined on the first semiconductor channel and applying a second voltage to a second semiconductor channel of the semiconductor channels, wherein the second semiconductor channel is adjacent to the first semiconductor channel;
   in a second phase of the erase operation, applying the second voltage to the first semiconductor channel and applying the first voltage to the second semiconductor channel;
   wherein the voltage level of the first voltage is different from that of the second voltage, and the voltage polarity of the first voltage is opposite to that of the second voltage.

2. The data erase method according to claim 1, wherein the first and second semiconductor channels are disposed on adjacent layers of a memory stack and separated by a dielectric strip, the word lines are disposed on the sidewall of the memory stack, the data erase method further comprises:
   in the first phase, applying the first voltage on both ends of the first semiconductor channel and applying the second voltage on both ends of the second semiconductor channel; and
   in the second phase, applying the second voltage on the both ends of the first semiconductor channel and applying the first voltage on the both ends of the second semiconductor channel.

3. The data erase method according to claim 1, wherein the semiconductor channels vertically pass through the word lines to constitute a 3D vertical channel memory structure, the data erase method further comprises:
   in the first phase, applying the first voltage on both ends of the first semiconductor channel and applying the second voltage on both ends of the second semiconductor channel; and
   in the second phase, applying the second voltage on the both ends of the first semiconductor channel and applying the first voltage on the both ends of the second semiconductor channel.

4. The data erase method according to claim 1, wherein both ends of the first semiconductor channel are electrically connected to a first bit line and a first source line, respectively, and both ends of the second semiconductor channel are electrically connected to a second bit line and a second source line, respectively, the data erase method further comprises:
   in the first phase, applying the first voltage to the first semiconductor channel via the first bit line and the first source line simultaneously and applying the second voltage to the second semiconductor channel via the second bit line and the second source line simultaneously; and
   in the second phase, applying the second voltage to the first semiconductor channel via the first bit line and the first source line simultaneously and applying the first voltage to the second semiconductor channel via the second bit line and the second source line simultaneously.

5. The data erase method according to claim 1, further comprising:
   in the first phase, maintaining the memory cells defined on the second semiconductor channel in a non-erased state; and
   in the second phase, maintaining the memory cells defined on the first semiconductor channel in an erased state and erasing data stored in the memory cells defined on the second semiconductor channel.

6. A three dimensional (3D) memory device, comprising:
   a plurality of word lines; and
   a plurality of semiconductor channels, wherein the semiconductor channels intersect with the word lines to form a plurality of memory cells;
   wherein in a first phase of an erase operation, a first voltage is applied to a first semiconductor channel of the semiconductor channels to erase data stored in the memory cells defined on the first semiconductor channel and a second voltage is applied to a second semiconductor channel of the semiconductor channels, the second semiconductor channel is adjacent to the first semiconductor channel; and
   in a second phase of the erase operation, the second voltage is applied to the first semiconductor channel and the first voltage is applied to the second semiconductor channel;

wherein the voltage level of the first voltage is different from that of the second voltage, and the voltage polarity of the first voltage is opposite to that of the second voltage.

7. The 3D memory device according to claim 6, wherein the first and second semiconductor channels are disposed on adjacent layers of a memory stack and separated by a dielectric strip, the word lines are disposed on the sidewall of the memory stack.

8. The 3D memory device according to claim 6, wherein the semiconductor channels vertically pass through the word lines to constitute a 3D vertical channel memory structure.

9. The 3D memory device according to claim 6, wherein both ends of the first semiconductor channel are electrically connected to a first bit line and a first source line, respectively, and both ends of the second semiconductor channel are electrically connected to a second bit line and a second source line, respectively;
   wherein in the first phase, the first voltage is applied to the first semiconductor channel via the first bit line and the first source line simultaneously and the second voltage is applied to the second semiconductor channel via the second bit line and the second source line simultaneously; and
   in the second phase, the second voltage is applied to the first semiconductor channel via the first bit line and the first source line simultaneously and the first voltage is applied to the second semiconductor channel via the second bit line and the second source line simultaneously.

10. The 3D memory device according to claim 6, wherein in the first phase, the memory cells defined on the second semiconductor channel are maintained in a non-erased state; and
   in the second phase, the memory cells defined on the first semiconductor channel are maintained in an erased state and data stored in the memory cells defined on the second semiconductor channel are erased.

11. A three dimensional (3D) memory device, comprising:
a plurality of word lines; and
a plurality of semiconductor channels, wherein the semiconductor channels intersect with the word lines to form a plurality of memory cells, the semiconductor channels comprises:
a plurality of first semiconductor channels; and
a plurality of second semiconductor channels disposed alternately with the first semiconductor channels;
wherein in a first phase of an erase operation, a first voltage is applied to the first semiconductor channels to erase data stored in the memory cells defined on the first semiconductor channels and a second voltage is applied to the second semiconductor channels; and
in a second phase of the erase operation, the second voltage is applied to the first semiconductor channels and the first voltage is applied to the second semiconductor channels;
wherein the voltage level of the first voltage is different from that of the second voltage, and the voltage polarity of the first voltage is opposite to that of the second voltage.

12. The 3D memory device according to claim 11, wherein the first semiconductor channels and the second semiconductor channels are disposed alternately in a memory stack and the word lines are disposed on the sidewall of the memory stack.

13. The 3D memory device according to claim 11, wherein the semiconductor channels vertically pass through the word lines to constitute a 3D vertical channel memory structure.

14. The 3D memory device according to claim 11, wherein in the first phase, the memory cells defined on the second semiconductor channels are maintained in a non-erased state; and
   in the second phase, the memory cells defined on the first semiconductor channels are maintained in an erased state and data stored in the memory cells defined on the second semiconductors channel are erased.

* * * * *